United States Patent
Chung et al.

(10) Patent No.: US 6,184,118 B1
(45) Date of Patent: Feb. 6, 2001

(54) METHOD FOR PREVENTING THE PEELING OF THE TUNGSTEN METAL AFTER THE METAL-ETCHING PROCESS

(75) Inventors: Chen-Hui Chung, Chu Tung Chen; Bing-Chang Wu, Shu Lin, both of (TW)

(73) Assignee: United Microelectronics Corp., Hsinchu (TW)

(*) Notice: Under 35 U.S.C. 154(b), the term of this patent shall be extended for 0 days.

(21) Appl. No.: 09/033,372

(22) Filed: Mar. 2, 1998

(51) Int. Cl.⁷ ................................. H01L 21/44
(52) U.S. Cl. .................. 438/597; 438/629; 438/638; 438/639; 438/643; 438/648; 438/653; 438/656; 438/666; 438/669; 438/685
(58) Field of Search ........................... 438/597, 598, 438/599, 618, 629, 637, 638, 639, 643, 648, 653, 656, 666, 668, 669, 675, 685, 700, 720, 975

(56) References Cited

U.S. PATENT DOCUMENTS

| | | | |
|---|---|---|---|
| 5,534,461 | * 7/1996 | Kuwajima | 438/639 |
| 5,891,513 | * 4/1999 | Dubin et al. | 427/98 |
| 5,899,738 | * 5/1999 | Wu et al. | 438/618 |
| 5,945,716 | * 8/1999 | Iwasaki et al. | 257/383 |
| 5,958,800 | * 9/1999 | Yu et al. | 438/720 |
| 5,972,793 | * 10/1999 | Tseng | 438/692 |
| 6,002,182 | * 12/1999 | Madurawe | 257/797 |
| 6,008,075 | * 12/1999 | Lien et al. | 438/132 |

* cited by examiner

Primary Examiner—Jey Tsai
Assistant Examiner—Lynne A. Gurley
(74) Attorney, Agent, or Firm—Merchant & Gould P.C.

(57) ABSTRACT

The present invention is a method for preventing the peeling phenomena of the Tungsten metal in the integrated circuit after the metal-etching process. A semiconductor's substrate is provided. An integrated circuit is manufactured in the substrate. An intermetal-dielectric layer is formed on the substrate and it has the contacting holes and the verniers. A barrier layer is also formed on the intermetal-dielectric layer. A tungsten-metal layer is then deposited on the barrier layer. The barrier layer and the tungsten-metal layer are etched back to form the plugs of the contacting holes, the spacers of the vernier and the metal stoppers, which cover the edges of the verniers. Thus, the metal stoppers have a good adhesion with the barrier layer and the peeling of the tungsten spacer is prevented.

6 Claims, 3 Drawing Sheets

METHOD FOR PREVENTING THE PEELING OF THE TUNGSTEN METAL AFTER THE METAL-ETCHING PROCESS

FIELD OF THE INVENTION

The present invention relates to a method of manufacturing the integrated circuit, and more specifically, to a method for preventing the peeling of the tungsten metal in the integrated circuit after the metal-etching process.

BACKGROUND OF THE INVENTION

The manufacture of the integrated circuit is to form devices on a wafer and then the metallic stage of the integrated circuit is achieved. Consequently, the metallic stage is to form the contact holes on the active region of the devices and then deposit the metal layers to be filled into the contact holes.

In the stage of forming the contact holes of the integrated circuit, verniers of the integrated circuit are formed in this stage. The verniers of the integrated circuit are wide trenches on the substrate and are the alignment marks for the photolithography equipment. Please refer to FIG. 1, this drawing shows a cross-section's view of a substrate. On the substrate, a metallic structure is formed thereon. Firstly, a substrate 100 is provided. The substrate 100 is a semiconductor. The integrated circuit is manufactured in the substrate 100 and the integrated circuit is a semiconductor device or a logical circuit. Afterwards, a metal layer 110 is formed on the surface of the substrate 100 and an intermetal dielectric layer 120 is deposited on the metal layer 110. After the deposition, the intermetal dielectric layer 120 is etched back and the contact holes and verniers are then formed in the IMD layer 120. Also, the contact holes are the metal contact of the metal layer 110 and the verniers are the alignment marks of the integrated circuit for the photolithography stage.

Afterwards, a barrier layer 130 is deposited on the surface of the contact holes, vernier's region and IMD 120. A tungsten-metal layer is then formed on the surface of the barrier layer 130 and is etched back to remove part of the tungsten metal layer. The plugs 140 of the contact holes and the spacers 145 of the verniers are thus formed. Finally, an aluminum metal layer is formed on the surface and the metallic stage of integrated circuit is finished.

In the above structure, the verniers are the alignment marks for photolithography and the spacers are formed thereon. The tungsten spacers are easily peeled off in the etching stage of the tungsten metal so that the peeling part of the tungsten spacers can be the short between the cells of the integrated circuit.

Currently, the aligning method of the photolithography stages is a calculating procedure, which is to calculate the distances between the verniers. Referring to FIG. 2, this drawing shows two groups of the verniers and a top view of the verniers of the integrated circuit. One is vernier 200 and the other one is vernier 210. The aligning method of photolithography equipment is to calculate the distances between the vernier 200 and vernier 210. The black lines in FIG. 2 are gaps in the IMD 120. Referring to FIG. 3, this drawing illustrates the calculation of the alignment. In the aligning procedures, point A and point B are assigned on the vernier 200, and point C and point D are assigned on the vernier 210 initially. Afterwards the distance between point A and point C, and the distance between point A and point D, the distance between point B and point C, the distance between point B and point D are calculated. The aligning procedure is then finished following the distances checking.

Consequently, the verniers are necessary for manufacturing the integrated circuit. However, since the spacers of the verniers are very thin films. The peeling phenomena of the spacers is often happened after the etching of metal and deposition. Thus, a method of preventing the peeling phenomena is needed.

SUMMARY OF THE INVENTION

In accordance with the present invention, a method for preventing the peeling of the tungsten metal is disclosed. The method is described by using a preferred embodiment. A structure of the integrated circuit is constructed on a substrate. An intermetal-dielectric layer is deposited on the substrate. Contact holes and verniers are in the IMD layer. The contact holes are the metallic contact of the integrated circuit and the verniers are the alignment marks for the photolithography equipment. A barrier layer covers the surface of the contact holes, the wall of the verniers and the top surface of the IMD layer. A tungsten-metal layer is on the barrier layer and is filled into the contact holes so that the plugs of the contacting holes and the spacers of the verniers are formed. In addition, the tungsten-metal layer covers the edges of the verniers. Thus, the extended portion of the tungsten metal is a metal stopper of the integrated circuit and the adhesion between the metal stoppers and the barrier layer is good so that the peeling of the tungsten spacers is prevented by using the metal stoppers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method of preventing the peeling phenomena of the tungsten metal is described herein. A preferred embodiment is described in the following description, but the scope of the present invention is not limited to the preferred embodiment.

Figure 5:
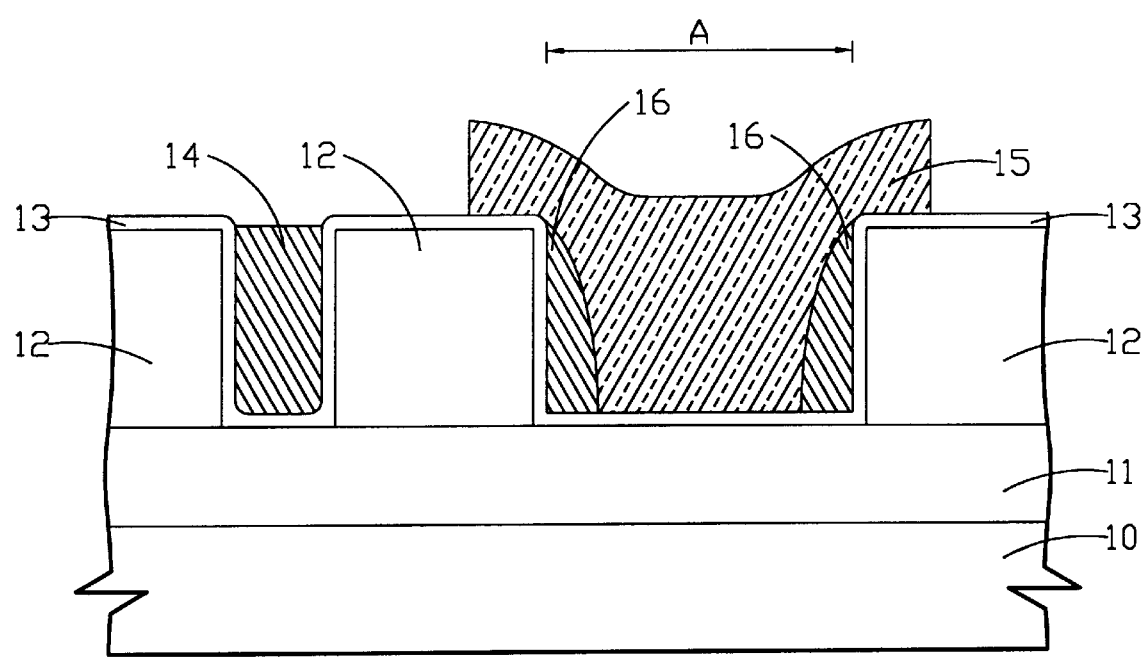
FIG. 5 is a cross-sectional view of a semiconductor device fabricated with metal stoppers in accordance with one embodiment of the present invention.

Referring to FIG. 5, the structure of the metallic contact is exhibited in this drawing. A metal layer 11 is on a substrate 10. The substrate 10 is a semiconductor substrate. The integrated circuit is in the substrate 10. An intermetal dielectric (IMD) 12 is formed on the metal layer 11. The material of the intermetal dielectric is silicon oxide. In the IMD 12, there are contacting holes and vernier regions. The barrier layer 13 is on the surface of IMD 12.

Figure 1:
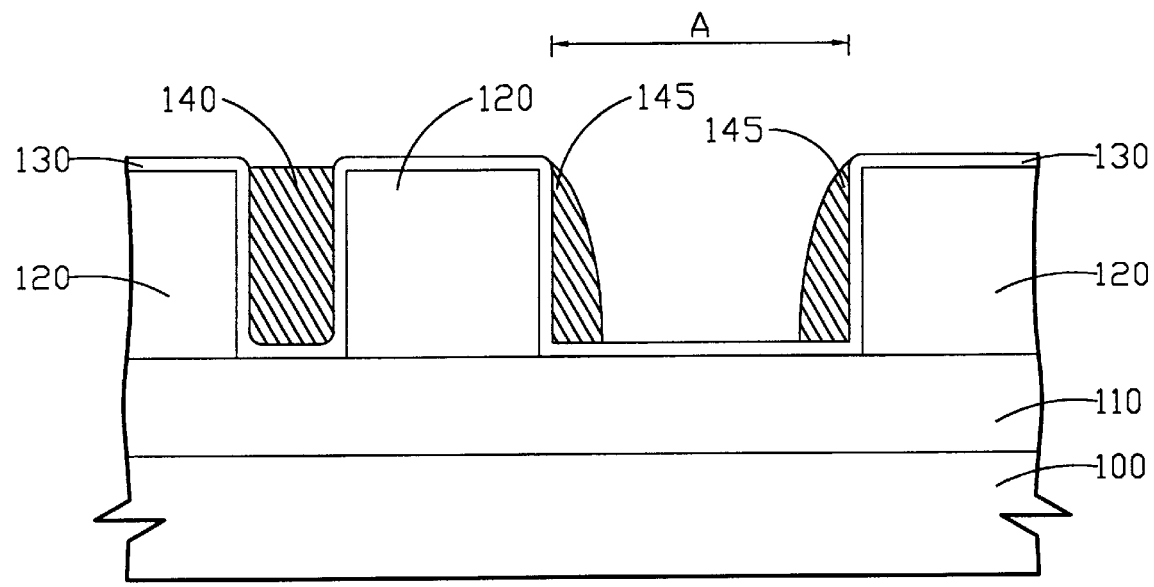
FIG. 1 is a cross-sectional view of a substrate, it includes the metal layer, the intermetal-dielectric layer, the barrier layer, the tungsten-metal layer and the aluminum-metal layer.
Figure 2:
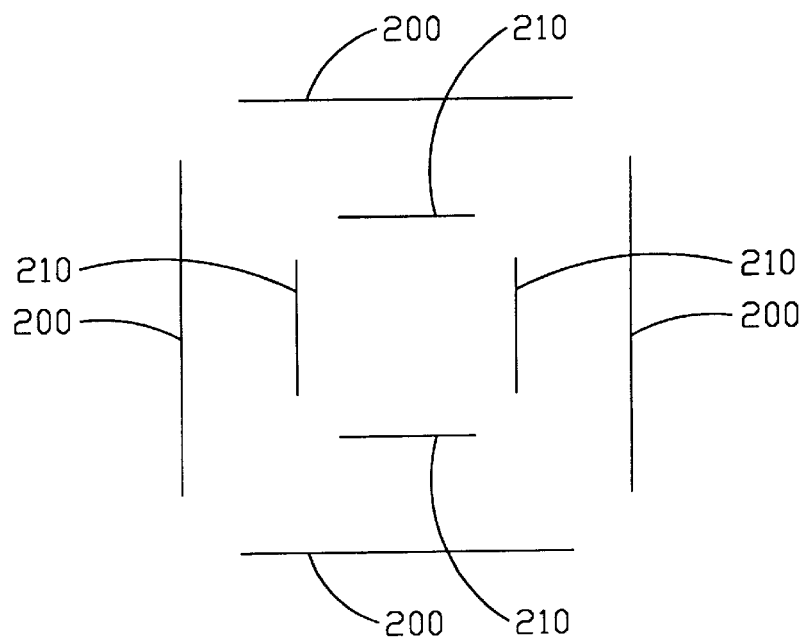
FIG. 2 is a top view of a pattern, it is the pattern of the verniers on the substrate.
Figure 3:
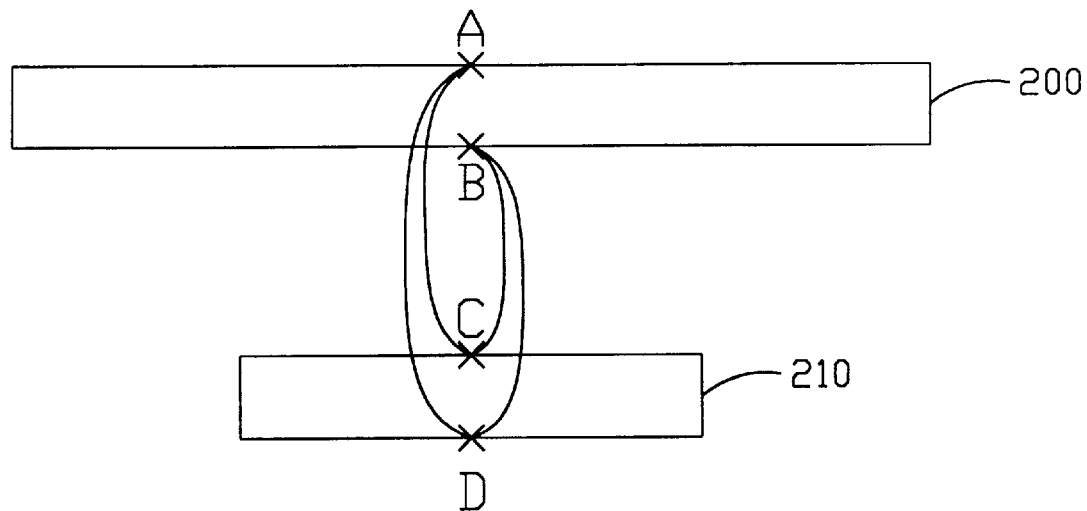
FIG. 3 illustrates the calculation of the distances, which is between two verniers on the substrate.
Figure 4:
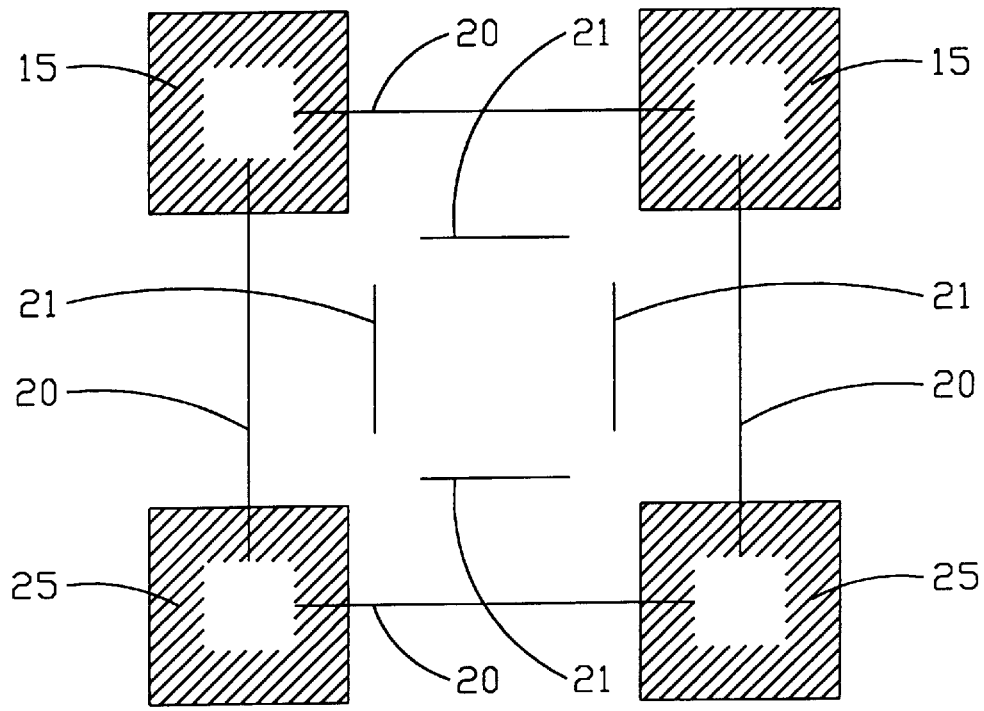
FIG. 4 is a top view of the verniers on the substrate, part of the verniers is covered by the metal stoppers.

A tungsten metal layer 14 is formed on the barrier layer 13 and is extended to the vernier region to cover the part portion of the verniers. The extended portion of the tungsten metal layer is under the metal stopper of the integrated circuit. Referring to FIG. 4, the top view of the verniers 20 and 21 and the metal stoppers is demonstrated. The extended portion of the tungsten metal layer is under the metal stopper 15, and it is on the vernier 20. As the tungsten metal layer 14 is etched to form the plugs 14 and the spacers 16 in FIG. 5 and after the following metal patterning, the metal stoppers are also formed in the same stage. The difference between the prior art and the present invention is this stage. In this stage, a pattern of the tungsten-metal layer is defined and the metal stoppers are formed. The other stages are not needed. The photomask of the pattern of the tungsten metal in the prior art is changed but other stages of the prior art must not be changed.

The metal stoppers 15 are covered on the corners of the vernier's square. Also, the middle portion of the vernier's lines can be used to align the photomask. The adhesion between the metal stoppers and the barrier layer is better than the adhesion between the spacers and the barrier layer. Thus, the peeling of the tungsten metal is not often happened.

As is understood by a person skilled in the art, the foregoing preferred embodiment of the present invention are illustrated of the present invention rather than limiting of the present invention. For example, the pattern of the tungsten metal in the photomask is a region, which covers the corners of the vernier's square. The region is not limited to any shape and it just needs an area, which is enough to cover the edges of the verniers.

While the preferred embodiment of the invention has been illustrated and described, it will be appreciated that various changes can be made therein without departing from the spirit and scope of the invention.

What is claimed is:

1. A method for preventing the peeling of a metal layer after metal-etching, the method comprising the steps of:

forming a first metal layer on a substrate;

forming an intermetal dielectric layer on said first metal layer, said intermetal dielectric layer including contact holes and trenches;

forming a barrier layer on a surface of said intermetal dielectric layer;

forming a second metal layer on a surface of said barrier layer, said second metal layer filling said contact holes and said trenches etching back said second metal layer to form plugs in said contact holes and spacers in said trenches;

forming a further metal layer; and etching back said further metal layer to form metal stoppers which cover at least an edge and only edge portion of said trenches.

2. The method of claim 1 wherein said intermetal dielectric layer is silicon oxide.

3. The method of claim 1, wherein said second metal layer is tungsten.

4. A method for forming a metal contact of an integrated circuit, the method comprising the steps of:

providing a substrate having an intermetal dielectric layer with contact holes and trenches therein;

forming a barrier layer on the surface of said substrate;

forming a metal layer on a surface of said barrier layer; and etching said metal layer to form plugs in said contact holes and spacers in said trenches;

forming a further metal layer; and etching said further metal layer to form metal stoppers which cover at least an edge of said trenches and block said spacers for peeling prevention.

5. The method of claim 4, wherein said intermetal dielectric layer is silicon oxide.

6. The method of claim 4, wherein said metal layer is tungsten.

* * * * *